United States Patent
Saia et al.

(10) Patent No.: US 6,323,096 B1
(45) Date of Patent: Nov. 27, 2001

(54) METHOD FOR FABRICATING A FLEXIBLE INTERCONNECT FILM WITH RESISTOR AND CAPACITOR LAYERS

(75) Inventors: Richard Joseph Saia, Schenectady; Kevin Matthew Durocher, Waterford; Herbert Stanley Cole, Burnt Hills, all of NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/162,800

(22) Filed: Sep. 29, 1998

Related U.S. Application Data

(62) Division of application No. 08/731,172, filed on Oct. 10, 1996, now Pat. No. 5,874,770.

(51) Int. Cl.[7] ..................................................... H01L 21/70
(52) U.S. Cl. ........................... 438/384; 438/106; 29/852; 174/258; 361/751
(58) Field of Search ..................................... 438/106, 382, 438/384; 29/846, 852; 174/254, 258; 361/748–751

(56) References Cited

U.S. PATENT DOCUMENTS

| | | |
|---|---|---|
| 4,677,042 | * 6/1987 | Kato et al. . |
| 4,783,695 | 11/1988 | Eichelberger et al. . |
| 4,788,767 | * 12/1988 | Desai et al. . |
| 4,835,704 | 5/1989 | Eichelberger et al. . |
| 4,894,115 | 1/1990 | Eichelberger et al. . |
| 4,897,153 | 1/1990 | Cole et al. . |
| 4,933,042 | 6/1990 | Eichelberger et al. . |

(List continued on next page.)

FOREIGN PATENT DOCUMENTS

| | | |
|---|---|---|
| 0700091A2 | 3/1996 | (EP) . |
| 60-55657 | 3/1985 | (JP) . |
| WO-91/11025 | * 7/1991 | (WO) . |

OTHER PUBLICATIONS

Wrobel, et al, "Plasma Chemical Vapour Deposition of Iron–Containing Hydrogenated Carbon Films Using a Single–Source Processor", Journal of Chemical Vapor Deposition, vol. 1, Jul. 1992., pp. 42–58.

Maissel and Gland Eds., "The Handbook of Thin Film Technology", McGraw–Hill Book Company, 1970, 1983 Reissue, Chapters 18 and 19, pp. 18.3–19.36.

*Primary Examiner*—Charles Bowers
*Assistant Examiner*—Stephen W. Smoot
(74) *Attorney, Agent, or Firm*—Ann M. Agosti; Jill M. Breedlove

(57) ABSTRACT

A method for fabricating a flexible interconnect film includes applying a resistor layer over one or both surfaces of a dielectric film; applying a metallization layer over the resistor layer with the resistor layer including a material facilitating adhesion of the dielectric film and the metallization layer; applying a capacitor dielectric layer over the metallization layer; and applying a capacitor electrode layer over the capacitor dielectric layer. The capacitor electrode layer is patterned to form a first capacitor electrode; the capacitor dielectric layer is patterned; the metallization layer is patterned to form a resistor; and the metallization layer and the resistor layer are patterned to form an inductor and a second capacitor electrode. In one embodiment, the dielectric film includes a polyimide, the resistor layer includes tantalum nitride, and the capacitor dielectric layer includes amorphous hydrogenated carbon or tantalum oxide. If the resistor and metallization layers are applied over both surfaces of the dielectric film, passive components can be fabricated on both surfaces of the dielectric film. The dielectric film can have vias therein with the resistor and metallization layers extending through the vias. A circuit chip can be attached and coupled to the passive components by metallization patterned through vias in an additional dielectric layer.

30 Claims, 8 Drawing Sheets

U.S. PATENT DOCUMENTS

| | | | |
|---|---|---|---|
| 4,937,133 | * | 6/1990 | Watanabe et al. . |
| 5,042,945 | * | 8/1991 | Shibata et al. . |
| 5,108,825 | | 4/1992 | Wojnarowski et al. . |
| 5,159,239 | * | 10/1992 | Ekkelboom et al. . |
| 5,161,093 | | 11/1992 | Gorczyca et al. . |
| 5,172,304 | | 12/1992 | Ozawa et al. . |
| 5,338,975 | | 8/1994 | Cole, Jr. et al. . |
| 5,353,195 | | 10/1994 | Fillion et al. . |
| 5,353,498 | | 10/1994 | Fillion et al. . |
| 5,370,766 | | 12/1994 | Desaigoudar et al. . |
| 5,422,513 | | 6/1995 | Marcinkiewicz et al. . |
| 5,436,062 | | 7/1995 | Schmidt et al. . |
| 5,450,263 | | 9/1995 | Desaigoudar et al. . |
| 5,479,316 | | 12/1995 | Smrtic et al. . |
| 5,518,964 | * | 5/1996 | DiStefano et al. . |
| 5,527,741 | | 6/1996 | Cole et al. . |
| 5,530,288 | | 6/1996 | Stone . |
| 5,548,099 | | 8/1996 | Cole et al. . |
| 5,559,363 | | 9/1996 | Immorlica, Jr. . |
| 5,563,762 | | 10/1996 | Leung et al. . |
| 5,583,739 | | 12/1996 | Vu et al. . |
| 5,675,310 | | 10/1997 | Wojnarowski et al. . |
| 5,683,928 | | 11/1997 | Wojnarowski et al. . |
| 5,684,304 | | 11/1997 | Smears . |
| 5,736,448 | | 4/1998 | Saia et al. . |

* cited by examiner

METHOD FOR FABRICATING A FLEXIBLE INTERCONNECT FILM WITH RESISTOR AND CAPACITOR LAYERS

This application is a division of application Ser. No. 08/731,172, filed Oct. 10, 1996, now U.S. Pat. No. 5,874,770.

This invention was made with Government support under contract number N66001-96-C-8612 awarded by DARPA. The Government has certain rights in the invention.

BACKGROUND OF THE INVENTION

In one form of high density interconnect (HDI) circuit module, an adhesive-coated polymer film overlay having via openings covers a substrate which can support integrated circuit chips in chip wells. The polymer film provides an insulated layer upon which is deposited a metallization pattern for interconnection of substrate metallization and/or individual circuit chips through the vias. Methods for performing an HDI process using overlays are further described in Eichelberger et al., U.S. Pat. No. 4,783,695, issued Nov. 8, 1988, and in Eichelberger et al., U.S. Pat. No. 4,933,042, issued Jun. 12, 1990. Generally a plurality of polymer film overlays and metallization patterns are used.

In another form of circuit module fabrication, as described by Cole et al., U.S. Pat. No. 5,527,741, issued Jun. 18, 1996, a method for fabricating a circuit module includes using a flexible interconnect layer having a metallized base insulative layer and an outer insulative layer. At least one circuit chip having chip pads is attached to the base insulative layer and vias are formed in the outer and base insulative layers to expose selected portions of the base insulative layer metallization and the chip pads. A patterned outer metallization layer is applied over the outer insulative layer extending through selected ones of the vias to interconnect selected ones of the chip pads and selected portions of the base insulative layer metallization.

Fabrication of thin film resistors, capacitors, and inductors is described in *The Handbook of Thin Film Technology*, chs. 18 and 19 (Maissel and Glang eds., McGraw-Hill Book Company 1970, 1983 Reissue).

Commonly assigned Wojnarowski et al., "Thin Film Resistors on Organic Surfaces," U.S. Pat. No. 5,675,310, filed Dec. 5, 1994, describes a method for fabricating a thin film resistor comprising: applying a tantalum nitride layer over an organic dielectric layer, applying a metallization layer over the tantalum nitride layer, and patterning the metallization layer with a first portion of the metallization layer situated apart from a second portion of the metallization layer and both the first and second portions being at least partially situated on th tantalum nitride layer. After patterning the metallization layer, the resistance value between the first and second portions of the metallization layer can be determined and compared to a predetermined resistance value, and at least one of the first and second portions can be trimmed to obtain a modified resistance value between the first and second portions that is closer to the predetermined resistance value than the determined resistance value. Preferably, the tantalum nitride layer comprises a hexagonal closed packed $Ta_2N$ structure and the dielectric layer comprises a polyimide. Commonly assigned Wojnarowski et al., "Application of Thin Film Electronic Components on Organic and Inorganic Surfaces," U.S. Pat. No. 5,683,928, filed Dec. 5, 1994, describes a method for the manufacture of precision electronic components such as resistors, inductors, and capacitors, for example, on a polymer or ceramic surface. The electronic components can be deposited and trimmed to precise or matched values without having precise depositions of all of the pre-patterned materials. Thin film electronic components are deposited on a surface, parameter values are measured or estimated, a correction offset file is generated, and the components are trimmed using adaptive lithography to a very close tolerance. A computer program can be used to enable the adjustment of electronic components by changing the physical length of an inductor coil or resistor lead, or by changing the capacitor plate area.

Commonly assigned Saia et al., "Structure and Fabrication Method for Thin Film Capacitors," U.S. Pat. No. 5,736,448, filed Dec. 4, 1995, describes structures and methods of incorporating thin film capacitors on polymer layers such as those in laminated high density interconnect (HDI) multichip modules and in flexible interconnect layers with good adhesion. The capacitors can be fabricated using interconnect metallization (titanium coated with copper coated with titanium) as the lower capacitor plate, amorphous hydrogenated carbon (commonly referred to as diamond-like carbon or DLC) as the capacitor dielectric material, and a sputtered metallization layer as the upper capacitor plate. Good adhesion of DLC to a capacitor plate can be obtained with a thin molybdenum adhesion layer and a pressure graded DLC deposition using an organic precursor including oxygen. The integral capacitors can be fabricated using a fabrication process compatible with conventional HDI and flexible interconnect materials.

SUMMARY OF THE INVENTION

It would be advantageous to have an efficient, cost-effective, and space-saving fabrication method and structure for integration of passive components on flexible interconnect layers. It would also be advantageous to have a framed structure for distortion-free deposition and fabrication of such flexible interconnect layers and to have a composite thin film structure from which interconnect areas and passive components can be fabricated.

In the present invention, a flexible film structure has thin film resistors, capacitors, and inductors fabricated thereon and integrated with film metallization. Tantalum nitride ($Ta_2N$) films can be used as adhesion primer layers for copper metallization or as thin film resistor material, and DLC or tantalum oxide ($Ta_2O_5$) can be used for fabrication of the thin film capacitors.

Briefly, according to one embodiment of the present invention, for example, a method for fabricating a flexible interconnect film includes applying a resistor layer over one or both surfaces of a dielectric film; applying a metallization layer over the resistor layer with the resistor layer including a material facilitating adhesion of the dielectric film and the metallization layer; applying a capacitor dielectric layer over the metallization layer; and applying a capacitor electrode layer over the capacitor dielectric layer. The capacitor electrode layer is patterned to form a first capacitor electrode; the capacitor dielectric layer is patterned; the metallization layer is patterned to form a resistor; and the metallization layer and the resistor layer are patterned to form an inductor and a second capacitor electrode. In one embodiment, during application and patterning of the layers, the dielectric film is efficiently maintained in a rigid form without distortion by use of a frame.

In one embodiment, the dielectric film includes a polyimide, the resistor layer includes tantalum nitride, and the capacitor dielectric layer includes amorphous hydrogenated carbon or tantalum oxide. If the resistor and metallization layers are applied over both surfaces of the dielectric film, passive components can be fabricated on both surfaces of the dielectric film. The dielectric film can have vias therein with the resistor and metallization layers extending through the vias. A circuit chip can be attached and coupled to the passive components by metallization patterned through vias in an additional dielectric layer.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF A PREFERRED EMBODIMENT OF THE INVENTION

Figure 1:
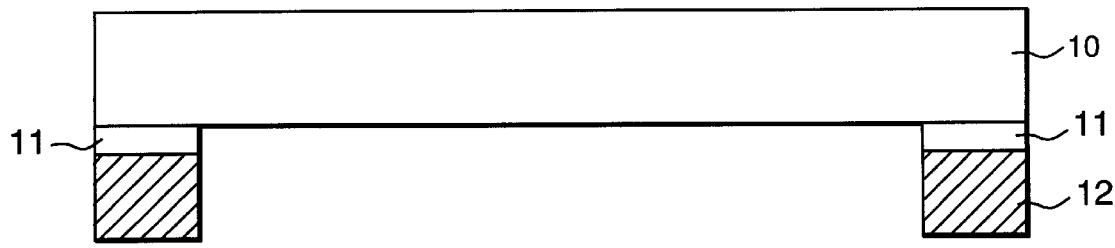
FIG. 1 is a sectional side view of a dielectric film mounted on a frame.

FIG. 1 is a sectional side view of a dielectric film 10 mounted on a frame 12. Although a frame 12 is useful, the frame is not required to practice the present invention.

Dielectric film 10 may comprise a polymer material such as a polyimide or a polyester, for example, that is dimensionally stable at temperatures at or below about 150° C. to be compatible with flexible interconnect film processing. For flexible interconnect films that will undergo further processing, such as, for example, high density interconnect processing, at higher temperatures, the material selected for dielectric film 10 must be capable of withstanding those higher temperatures. The appropriate thickness of the dielectric film can be chosen to achieve its planned use. In one embodiment, the thickness ranges from about 1 mil to about 2 mils.

Metallization of dielectric films has been achieved with roll-to-roll processes and panel processes using conventional deposition techniques such as sputtering, evaporation, and electroless deposition. In the present invention, a frame is preferred for more rigidly supporting the dielectric film. In one embodiment, the frame comprises a metal having a coefficient of thermal expansion (CTE) slightly lower than the dielectric film. The CTE difference is expected to range from about 10 ppm/° C. (parts per million per degrees centigrade) to about 40 ppm/° C., for example, with a preferred range from about 10 ppm/° C. to about 15 ppm/° C. By creating such a CTE difference, the dielectric film can be kept under a slight positive tension and thus wrinkle-resistant at room temperature. The frame can have any desired size and shape. A round frame having a diameter ranging from about 5 inches to about 7 inches has been found to be useful in one embodiment.

In one embodiment, free-standing KAPTON™ polyimide (KAPTON is a trademark of E.I. du Pont de Nemours & Co.) is mounted on a round metal frame. An adhesive 11 preferably comprising a material capable of adhering at low temperatures can be applied to the metal frame. Examples of adhesives include materials such as ULTEM™ polyetherimide (ULTEM is a trademark of General Electric Company, Pittsfield, Mass.) and MULTIPOSIT™ XP-9500 thermoset epoxy (MULTIPOSIT is a trademark of Shipley Company Inc., Marlborough, Mass.). The dielectric film can be attached by positioning the dielectric film on the frame and pressing and heating the dielectric film, adhesive, and frame to a temperature above the softening point of the adhesive. The attachment process should provide a tension between the frame and the dielectric film sufficient to maintain dielectric film stability and uniformity during subsequent application of materials for forming passive components. Providing a more planar and uniform dielectric film enables application of a resistor layer (as well as overlying metallization and dielectric layers) having improved thickness uniformity.

A round shape is useful for providing dimensional stability which results from a uniform radial expansion of the dielectric film. In one embodiment a KAPTON E polyimide dielectric layer having a CTE ranging from about 13 ppm/° C. to about 16 ppm/° C. is applied to an invar ferronickel frame (an alloy comprising nickel 35.8%, steel 64%, carbon 0.2%) having a CTE ranging from about 1.3 ppm/° C. to about 2.1 ppm/° C. In another embodiment a KAPTON H polyimide dielectric film having a CTE ranging from about 20 ppm/° C. to about 48 ppm/° C. is applied to a titanium frame having a CTE ranging from about 8.5 ppm/° C. to about 9.9 ppm/° C.

Figure 2:
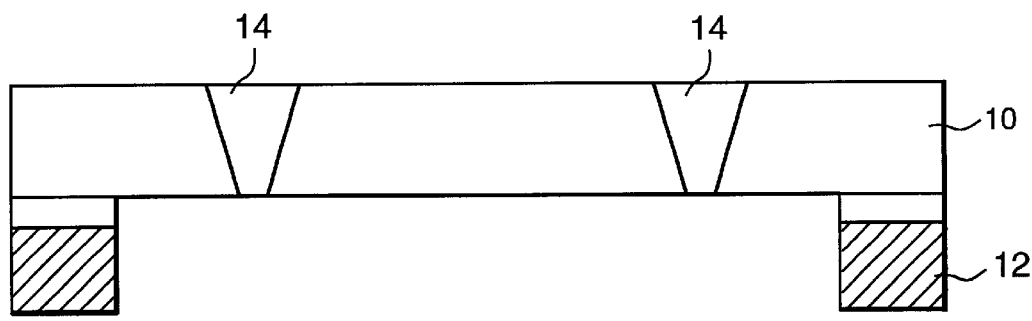
FIG. 2 is a view similar to that of FIG. 1 with vias formed through the dielectric film.

FIG. 2 is a view similar to that of FIG. 1 with vias 14 formed through the dielectric film. The vias can be laser drilled, mechanically punched, or chemically etched. The vias can be formed in the dielectric film either prior to or after attachment of the dielectric film to the frame. The vias, which are optional, are particularly useful in embodiments, as shown below, wherein passive components are formed on both surfaces of dielectric film 10.

Figure 3:
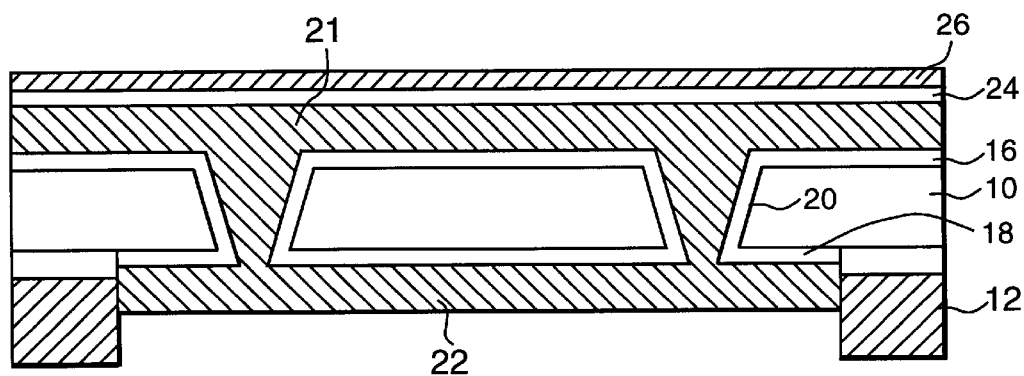
FIG. 3 is a view similar to that of FIG. 2 with resistor layers, metallization layers, and a capacitor dielectric layer applied to the dielectric film.

FIG. 3 is a view similar to that of FIG. 2 with resistor layers 16 and 18, metallization layers 21 and 22, a capacitor dielectric layer 24, and a capacitor electrode layer 26 applied to the dielectric film. During application of these layers, the temperature is preferably maintained below about 100° C. to about 150° C. to prevent wrinkling of the dielectric film.

A resistor layer can be applied over one or both surfaces of dielectric film 10. In one embodiment, the resistor layer is applied by sputter-depositing tantalum nitride ($Ta_2N$) on a polyimide dielectric film. Other potentially useful resistor layer materials include chromium silicide, tantalum oxynitride, and nichrome, for example. These materials are useful because they can potentially serve as adhesion layers for overlying metallization layers. The thickness of the resistor layer typically ranges from about 250 Å to about 5000 Å.

If two layers 16 and 18 of resistor material are used, the layers can have either the same or different thicknesses. Different thicknesses may be useful for achieving specific resistor values. If vias 14 are present, the resistor material preferably extends through the vias (as represented by resistor layer 20).

A metallization layer can be applied over each resistor layer. In FIG. 3, metallization layer 21 is applied over resistor layer 16 and metallization layer 22 is applied over resistor layer 18. If vias 14 are present, one or both of the metallization layers extends through the vias to couple the other metallization layer. In one embodiment, the metallization layer is applied by sputtering a layer of copper having a thickness of 3000 Å and electroplating a layer of copper having a thickness of 4 micrometers.

The resistor layer preferably comprises a material also capable of serving as an adhesion layer of the dielectric film and the metallization layer. Tantalum nitride can be used as a seed layer between a polyimide dielectric layer and a copper metallization layer. This is advantageous because copper has low adhesion to polyimides (from about 2 pounds per inch to about 4 pounds per inch). Using a tantalum nitride layer increases the adhesion of copper from about 4 pounds per inch to about 6 pounds per inch.

Figure 13:
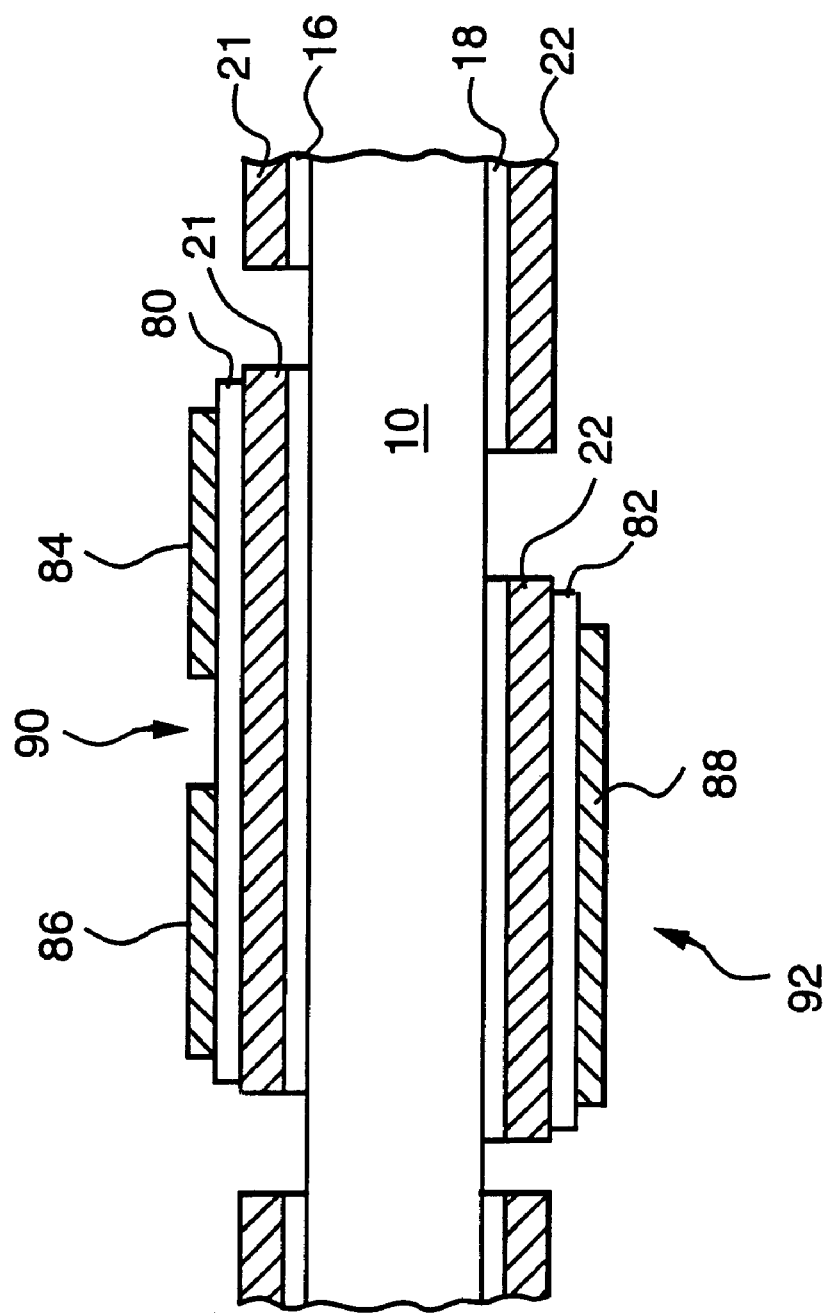
FIG. 13 is a sectional view of a portion of dielectric film having two capacitors situated on opposite surfaces.

A capacitor dielectric layer can be applied over one (as shown in FIG. 3) metallization layer or, if desired, each respective one of two metallization layers (as shown in FIG. 13) by deposition of a chosen dielectric material. Suitable dielectric materials include, for example amorphous hydrogenated carbon (DLC), tantalum oxide ($Ta_2O_5$), aluminum oxide ($Al_2O_3$), antimony oxide ($Sb_2O_3$ or $Sb_2O_4$), bismuth oxide ($Bi_2O_3$), hafnium oxide ($HfO_2$), niobium oxide ($Nb_2O_5$), tungsten oxide ($WO_3$), yttrium oxide ($Y_2O_3$), and zirconium oxide ($ZrO_2$). DLC can be deposited using a plasma deposition process, and the oxides can be deposited by reactive sputtering or anodic oxidation of the sputtered metal film, for example. The thickness of the capacitor dielectric layer typically ranges from about 1000 Å to about 5000 Å.

A capacitor electrode layer can be applied over the capacitor dielectric layer. The capacitor electrode layer may comprise any metal that can be applied over the capacitor dielectric layer. As described in aforementioned Saia et al., if DLC is used as the capacitor dielectric layer material, improved adhesion to a capacitor electrode can be achieved using a thin molybdenum adhesion layer and a pressure graded DLC deposition. An adhesion layer will not be needed by all types of capacitor dielectric layer materials. In one embodiment, a layer of copper is sputter-deposited to a thickness of 3000 Å.

The resistor, metallization, capacitor dielectric, and capacitor electrode layers form a composite thin film structure that can be used to fabricate a flexible interconnect film as described below. The layers can then be patterned to form resistors, capacitors, inductors, and interconnect areas. The resulting flexible interconnect film can be used in any of a number of multi-chip module applications such as, for example, high density interconnect, flip-chip, ball grid array, and direct wire bond processes.

Figure 4:
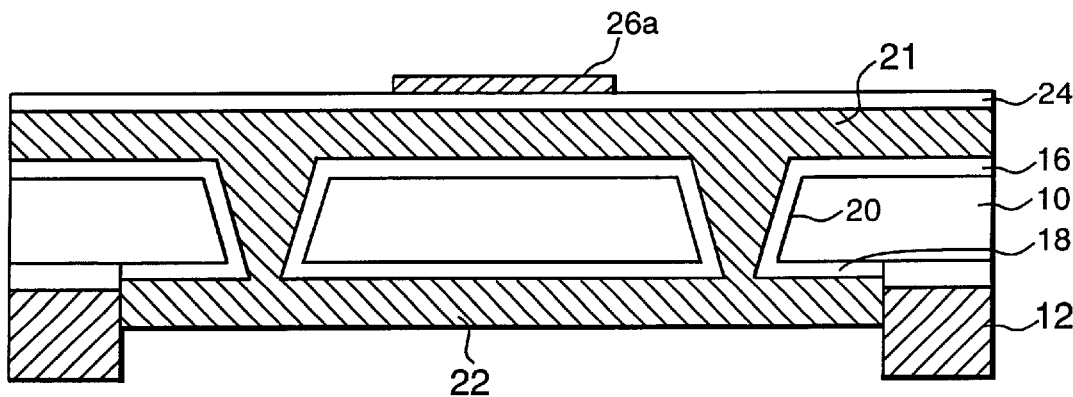
FIG. 4 is a view similar to that of FIG. 3 showing patterning of a metallization layer to provide a capacitor electrode.

FIG. 4 is a view similar to that of FIG. 3 showing patterning of the capacitor electrode layer 26 to provide a capacitor electrode 26a. In one embodiment, the patterning is achieved by applying photoresist (not shown) to both surfaces of the structure. This is useful even if only one side is patterned because the photoresist serves to protect the side not being patterned. If copper is used as the material for the capacitor electrode, the photoresist can be patterned and the copper can be etched in a $FeCl_3$ solution, for example, through the photoresist openings.

Figure 5:
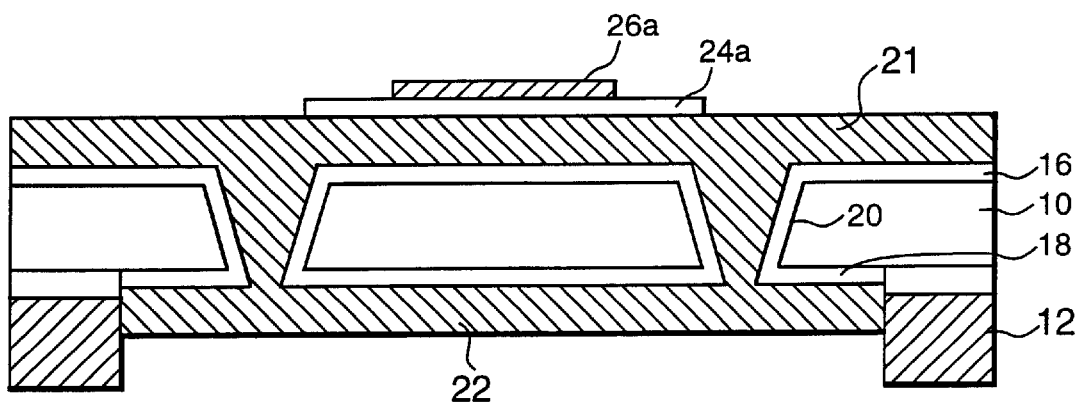
FIG. 5 is a view similar to that of FIG. 4 showing patterning of the capacitor dielectric layer.

FIG. 5 is a view similar to that of FIG. 4 showing patterning of the capacitor dielectric layer 24 to form a patterned capacitor dielectric layer 24a. Additional photoresist (not shown) can be applied to the patterned side with or without removing the previously applied photoresist. The photoresist can be exposed and patterned, and the capacitor dielectric layer can be etched. For example, a $CF_4$/Ar plasma etch can be used for $Ta_2O_5$ material, and an oxygen plasma etch can be used for DLC material.

Figure 6:
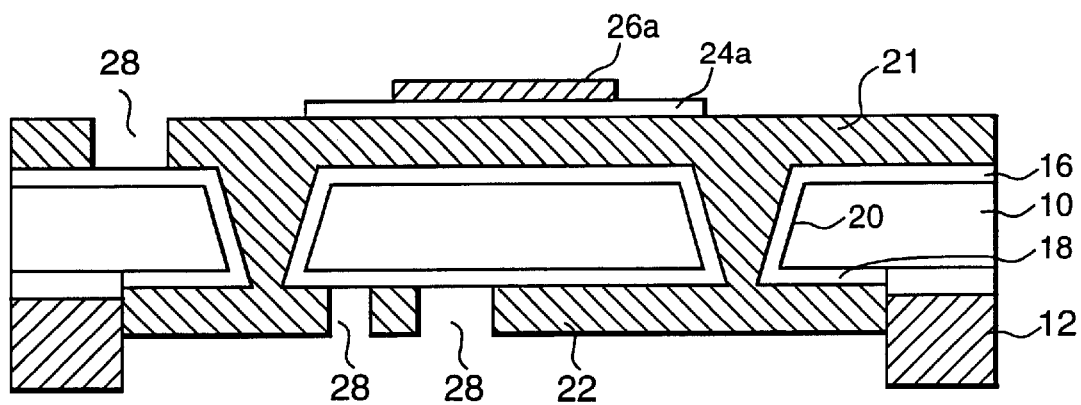
FIG. 6 is a view similar to that of FIG. 5 showing pattering of metallization layers to form resistors.

FIG. 6 is a view similar to that of FIG. 5 showing pattering of metallization layers to form openings which result in resistors 28. Photoresist and a solution and/or dry etch can be used to pattern the metallization layers.

Figure 7:
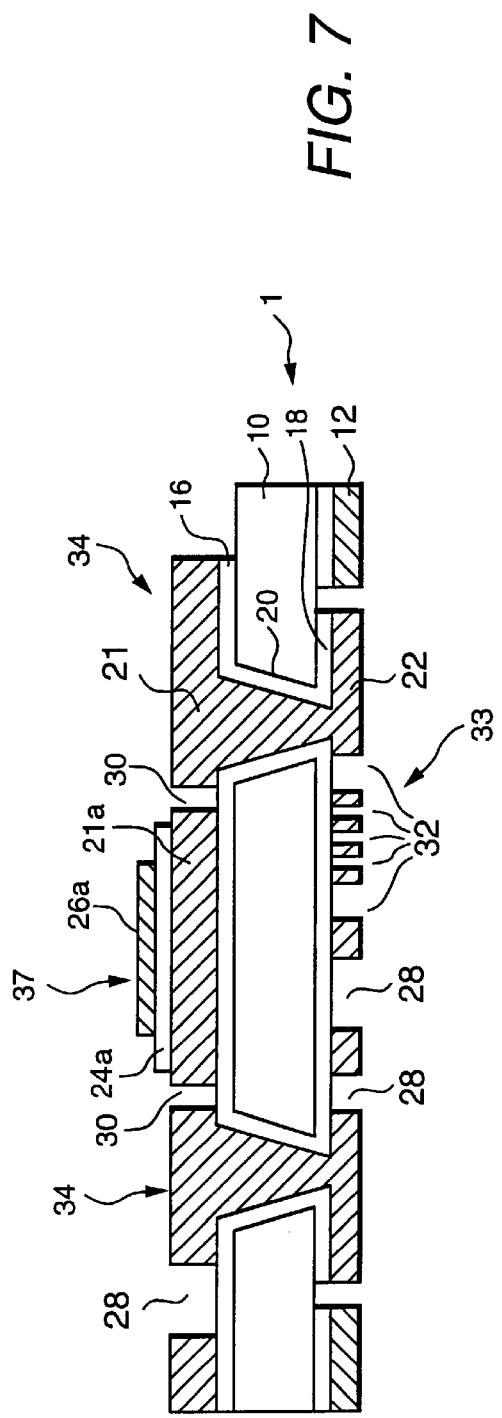
FIG. 7 is a view similar to that of FIG. 6 showing further patterning of metallization and resistor layers to provide a flexible interconnect film including resistors, an inductor, and a capacitor.

FIG. 7 is a view similar to that of FIG. 6 showing further patterning of metallization and resistor layers to provide a flexible interconnect film 1 including resistors, an inductor, and a capacitor. Copper can be etched with a $FeCl_3$ solution, and $Ta_2N$ can be etched with a $CF_4$/Ar plasma, for example.

The patterning of openings 30 to form capacitor 37 and openings 32 to form inductor 33 can be accomplished in either of two orders. In one embodiment, the resistor openings are formed in one mask and etch step and the capacitor and inductor openings are formed in another mask and two part etch step. Alternatively, the resistor openings and the portions of the capacitor and inductor openings situated in the metallization layers 21 and 22 are formed in the first mask step, and the remainder of the capacitor and inductor openings through resistor layers 16 and 18 are formed in the second mask step.

The capacitor electrode, the capacitor dielectric layer, and the second capacitor electrode comprise a capacitor 37. The passive components as shown in FIG. 7 include resistors 28, capacitor 37, and inductor 33. The position and number of passive components in FIG. 7 are for purposes of example only. In FIG. 7, some of the passive components are situated on an opposite surface of the dielectric film than others of the passive components. Passive components need not be situated on both surfaces. If vias are present in the dielectric film, when pattering the metallization and resistor layers, via metallization areas 34 can also be formed.

Figure 8:
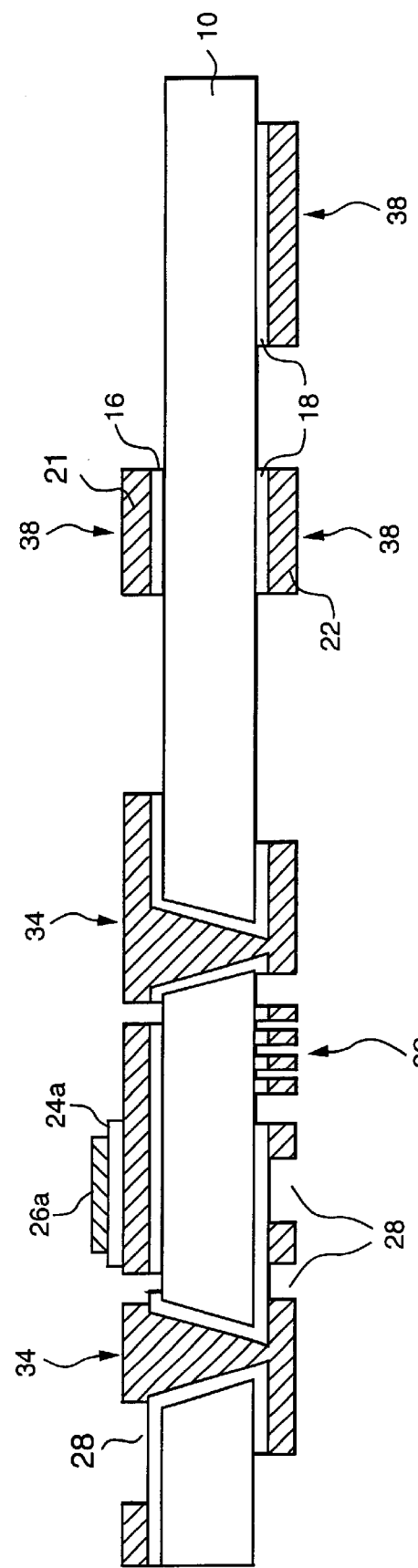
FIG. 8 is a sectional side view of the flexible interconnect film of FIG. 7 further including interconnect areas of the metallization layers.

FIG. 8 is a sectional side view of the flexible interconnect film of FIG. 7 further including interconnect areas 38 which can be formed when patterning the metallization and resistor layers to form the passive components. As discussed above, the flexible interconnect film can be used in any desired multi-chip module embodiment. The following description is a use of the flexible interconnect film in a high density interconnect embodiment.

FIGS. 9–12 are sectional side views illustrating an integration of the flexible interconnect film with a circuit chip in a multichip module.

Figure 9:
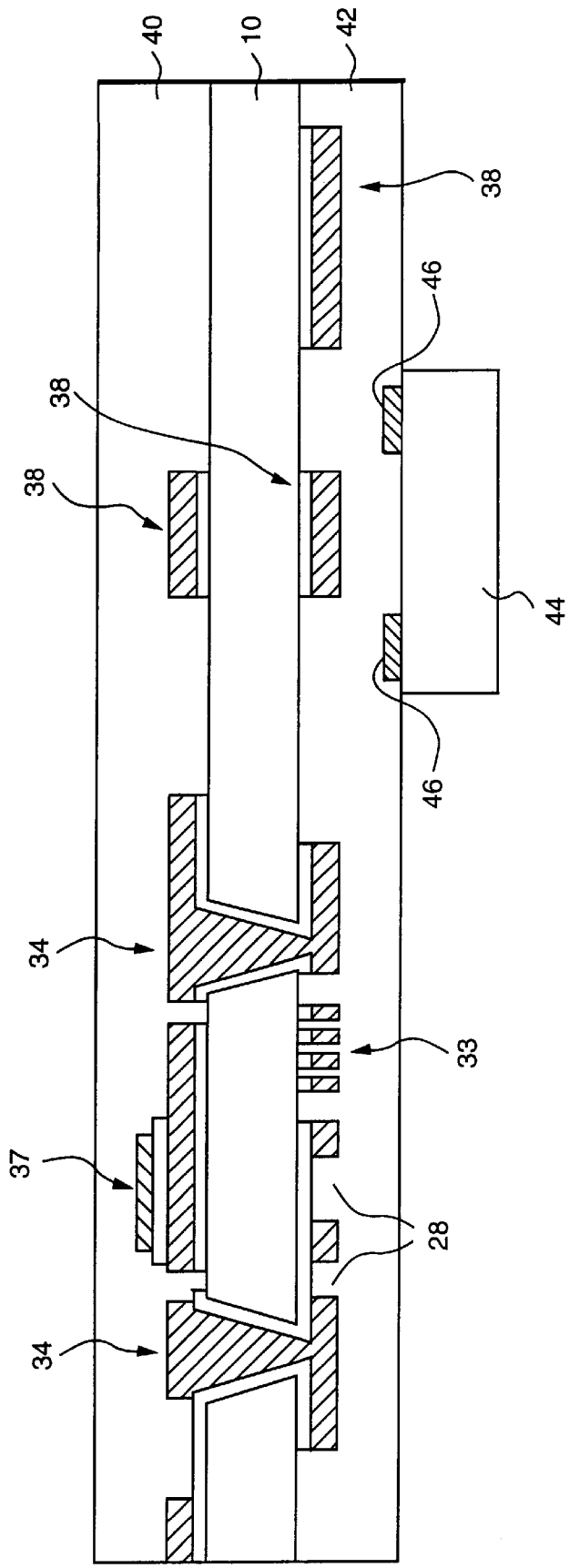
FIG. 9 is a view similar to that of FIG. 8 further showing the addition of an additional dielectric layer and a circuit chip attached to the flexible interconnect film by an adhesive.

FIG. 9 is a view similar to that of FIG. 8 further showing the addition of an additional dielectric layer 40 and a circuit chip 44 attached to dielectric film 10 of the flexible interconnect film by an adhesive 42. In one embodiment, additional dielectric layer 40 comprises a polymer such as ULTRADEL™ 5106 polyimide (ULTRADEL is a trademark of Amoco Chemicals, Naperville, Ill.) having a thickness ranging from about 12 microns to about 15 microns.

One or more circuit chips 44 may comprise any of a number of electrical circuit components, including integrated circuit (ICs) and discrete devices such as, for example, capacitors, resistors, inductors, and transducers. Adhesive 42 may comprise any thermoset or thermoplastic polymer which meets the thermal and bonding requirements of the assembly and has a thickness sufficient to maintain the adhesion. Other potentially useful adhesive materials include polyesters, polyimides, polybenzocyclobutane, polyetherimides, and siloxane-polyimide blends, for example. If an interconnect area 38 is situated between chip 44 and dielectric film 10, the adhesive should be sufficiently thick to prevent the interconnect area from touching the chip. Examples include MULTIPOSIT™ XP-9500 thermoset epoxy and siloxane polyimide epoxy having a thickness range of about 12 microns to about 15 microns.

Figure 10:
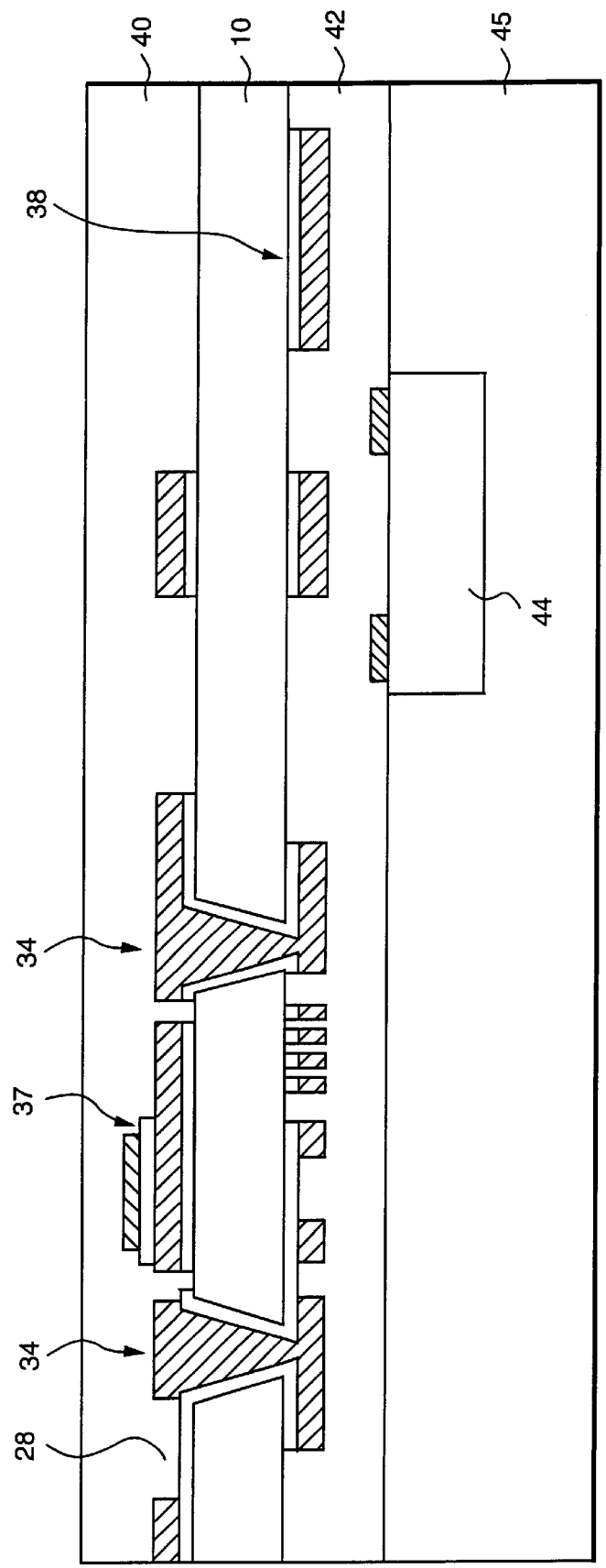
FIG. 10 is a view similar to that of FIG. 9 further showing a substrate supporting the circuit chip.

FIG. 10 is a view similar to that of FIG. 9 further showing a substrate 45 supporting circuit chip 44 and dielectric film 10. The flexible interconnect film can be used with or without the addition of an attached chip and/or substrate. If a substrate is applied, the chip can be lowered into predetermined cavities. In a preferred embodiment, the chip or chips can be attached face down to the flexible film, a mold form can be positioned around the chips and passive components, and plastic substrate molding material can be added and hardened in a similar manner as described in Fillion et al., U.S. Pat. No. 5,353,498, issued Oct. 11, 1994. In one embodiment, the molding material comprises PLASKON SMT-B-1 carbon-filled epoxy molding compound available from Plaskon Electronic Materials, of Philadelphia, Pa.

Figure 11:
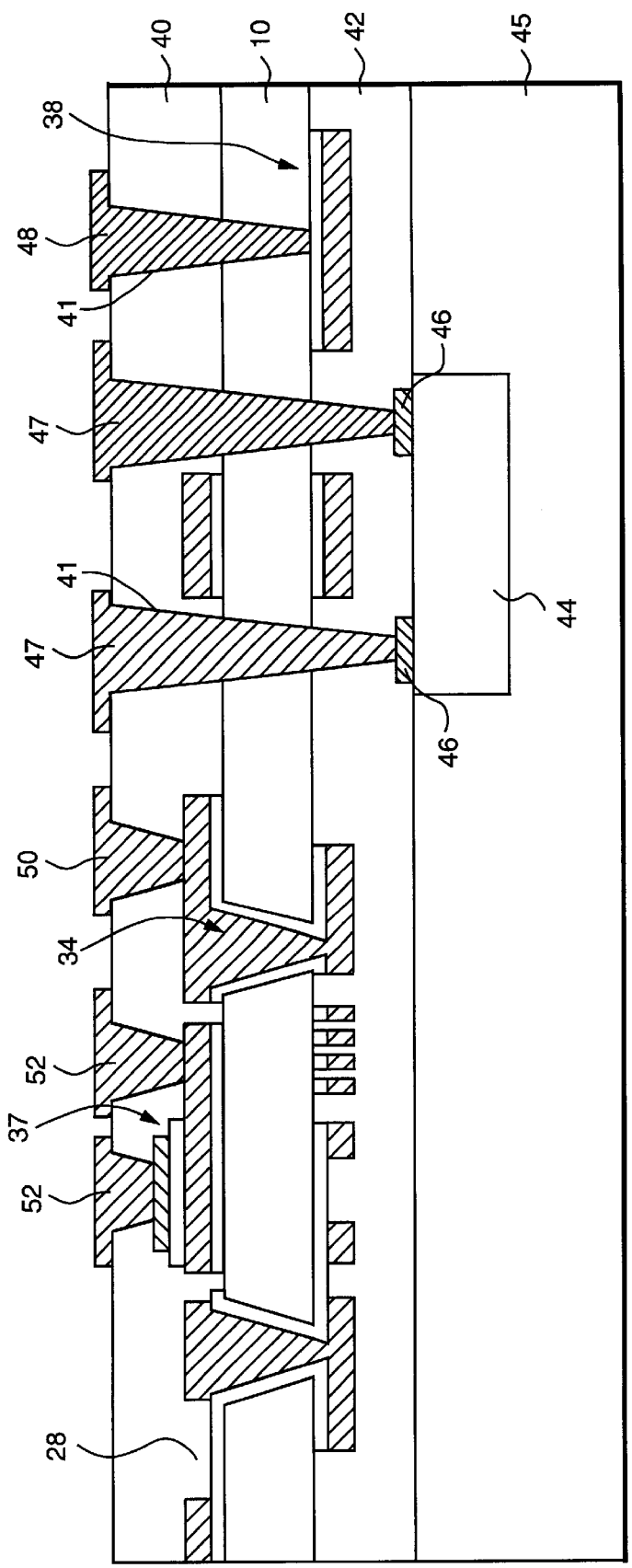
FIG. 11 is a view similar to that of FIG. 10 further showing interconnect metallization extending through vias in the dielectric film and the additional dielectric layer to passive components, interconnect areas, and chip pads.

FIG. 11 is a view similar to that of FIG. 10 further showing vias 41 in additional dielectric layer 40 and dielectric film 10 supporting interconnection metallization having portions 52 extending to capacitor 37, portion 50 extending to via metallization area 34, portions 47 extending to chip pads 46, and portion 48 extending to interconnect area 38. Other unshown portions of the interconnect metallization layer extend to the resistors and inductor. The vias can be formed by using a laser or a mask etch process. In one embodiment, as described in Eichelberger et al., U.S. Pat. No. 4,894,115, issued Jan. 16, 1990, additional dielectric layer 40 is repeatedly scanned with a laser which forms vias and then has a short plasma etch to clean the via surfaces prior to metallization.

The interconnect metallization can be formed by sputtering and/or plating, for example, and patterned with a standard photoresist and etch process. Eichelberger et al., U.S. Pat. No. 4,835,704, issued May 30, 1989, describes a useful adaptive lithography systems for patterning the metallization. The interconnect metallization in one embodiment comprises a thin adhesion layer of 1000 Å sputtered titanium, coated by a thin layer of 3000 Å sputtered copper, coated by a layer of electroplated copper to a thickness of 4 microns, for example. An optional buffer layer of 1000 Å of titanium can be applied over the electroplated copper. The interconnect metallization can be patterned using a photoresist and etch process.

Figure 12:
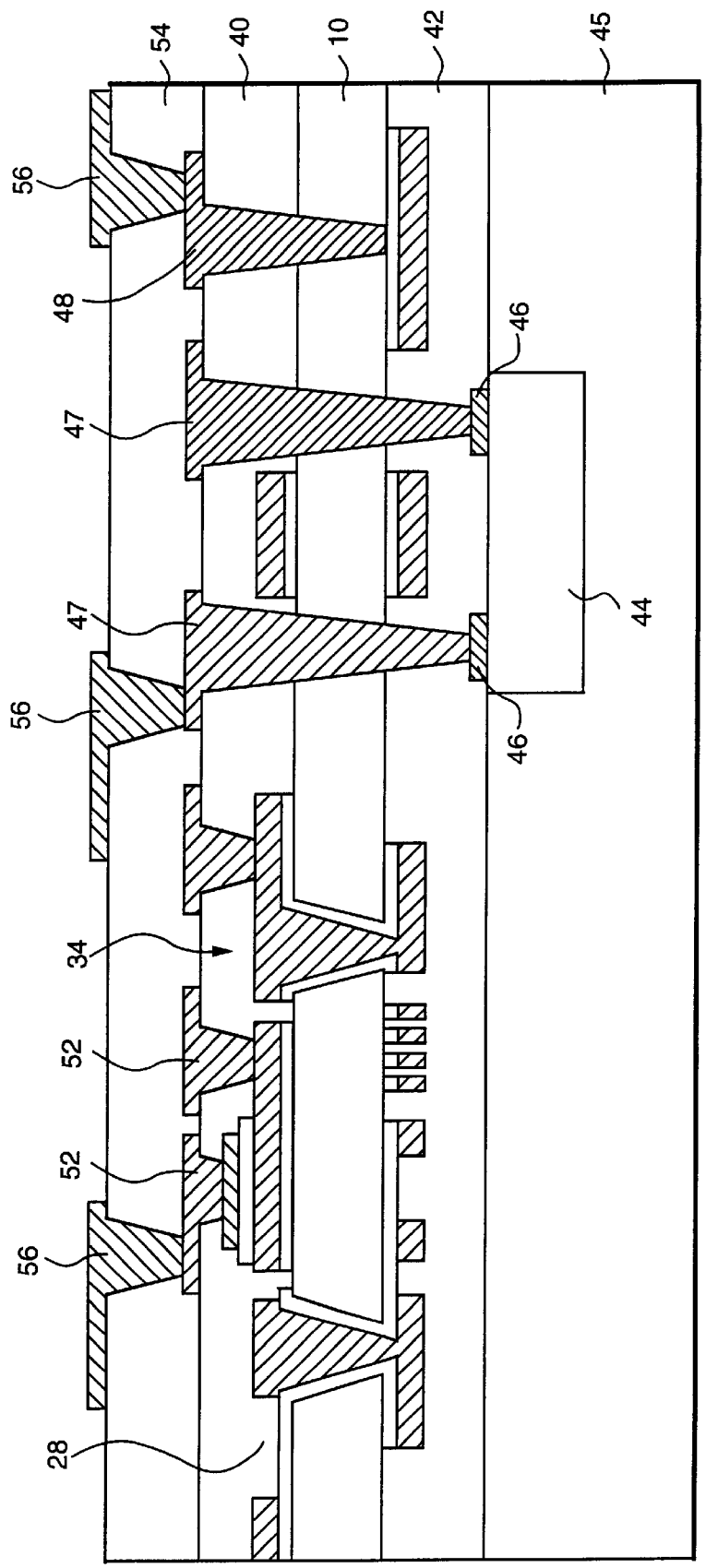
FIG. 12 is a view similar to that of FIG. 11 further showing a second additional dielectric layer having a second layer of interconnect metallization.

FIG. 12 is a view similar to that of FIG. 11 further showing a second additional dielectric layer 54 having a second layer of patterned interconnect metallization 56. The optional second additional dielectric layer and interconnect level may be needed for complex designs. In one embodiment, the second additional dielectric layer comprises a polyimide laminated with a siloxane polyimide epoxy (not shown), and the second layer of pattern interconnect metallization comprises titanium and copper layers as discussed with respect to FIG. 11.

FIG. 13 is a sectional view of a portion of dielectric film 10 having two capacitors 90 and 92 situated on opposite surfaces. The materials used for first and second capacitive dielectric layers 80 and 82 can be different, if desired, for flexibility in the film interconnect design. FIG. 13 further illustrates that the capacitors can be floating point capacitors, if desired. Capacitor 92 is a capacitor having a capacitor dielectric layer 82 between two electrodes 22 and 88, and capacitor 90 is a capacitor having one electrode 21 serving as a ground plane and two other electrodes 84 and 86 on an opposite surface of a capacitor dielectric layer 80.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method for fabricating a flexible interconnect film, the method comprising:

applying a resistor layer over a dielectric film;

applying a metallization layer over the resistor layer, the resistor layer comprising a material facilitating adhesion of the dielectric film and the metallization layer;

applying a capacitor dielectric layer over the metallization layer;

applying a capacitor electrode layer over the capacitor dielectric layer;

patterning the capacitor electrode layer to form a first capacitor electrode;

patterning the capacitor dielectric layer; and patterning the metallization layer and the resistor layer to form a second capacitor electrode.

2. The method of claim 1, further including, prior to applying the resistor layer, attaching the dielectric film to a frame.

3. The method of claim 2 wherein the frame has a coefficient of thermal expansion lower than a coefficient of thermal expansion of the dielectric film.

4. The method of claim 2, wherein the step of applying the resistor layer over the dielectric film includes applying two resistor layers, each respective resistor layer being applied over a respective one of two opposing surfaces of the dielectric film, wherein the step of applying the metallization layer includes applying two metallization layers, each respective metallization layer being applied over a respective resistor layer, wherein the step of applying a capacitor dielectric layer includes applying two capacitor dielectric layers, each respective capacitor dielectric layer being applied over a respective metallization layer, wherein the step of applying a capacitor electrode layer includes applying two capacitor electrode layers, each respective capacitor electrode layer being applied over a respective capacitor dielectric layer, wherein the step of patterning the capacitor electrode layer includes patterning the two capacitor electrode layers to form at least two first capacitor electrodes, wherein the step of patterning the capacitor dielectric layer includes patterning the two capacitor dielectric layers, and wherein the step of patterning the metallization layer and the resistor layer includes patterning the two metallization layers and the two resistor layers to form at least two second capacitor electrodes.

5. The method of claim 4, wherein the step of applying the two capacitor dielectric layers comprises applying two capacitor dielectric layers having different materials.

6. A method for fabricating a flexible interconnect film, the method comprising:
   applying a resistor layer over a dielectric film;
   applying a metallization layer over the resistor layer, the resistor layer comprising a material facilitating adhesion of the dielectric film and the metallization layer;
   applying a capacitor dielectric layer over the metallization layer;
   applying a capacitor electrode layer over the capacitor dielectric layer;
   patterning the capacitor electrode layer to form a first capacitor electrode;
   then patterning the capacitor dielectric layer;
   then patterning the metallization layer to form a resistor; and
   patterning the metallization layer and the resistor layer to form a second capacitor electrode.

7. The method of claim 6, further including, prior to applying the resistor layer, attaching the dielectric film to a frame.

8. The method of claim 7, wherein the frame has a coefficient of thermal expansion lower than a coefficient of thermal expansion of the dielectric film.

9. The method of claim 8, wherein the frame is round.

10. The method of claim 8, wherein the temperature of the dielectric film remains less than or equal to about 150° C.

11. The method of claim 6, wherein the step of applying the resistor layer comprises sputter-depositing tantalum nitride ($Ta_2N$) on the dielectric film.

12. The method of claim 11, wherein the step of applying the capacitor dielectric layer comprises depositing amorphous hydrogenated carbon or tantalum oxide ($Ta_2O_5$) over the metallization layer.

13. The method of claim 6,
   wherein the step of applying the resistor layer over the dielectric film includes applying the resistor layer over both of two opposing surfaces of the dielectric film,
   wherein the step of applying the metallization layer includes applying the metallization layer over at least portions of the resistor layer on the two opposing surfaces of the dielectric film,
   wherein the first capacitor electrode, the capacitor dielectric layer, and the second capacitor electrode comprise a capacitor,
   wherein a plurality of passive components comprise the resistor and the capacitor,
   wherein a first one of the passive components is situated on an opposite surface of the dielectric film than a second one of the passive components.

14. The method of claim 13, wherein the dielectric film has vias therein, and the steps of applying the resistor and metallization layers include coupling the resistor and metallization layers respectively through the vias.

15. The method of claim 6, wherein the step of patterning the metallization layer and the resistor layer comprises patterning interconnect areas.

16. The method of claim 15, further including attaching a circuit chip having chip pads to the dielectric film with an adhesive.

17. The method of claim 16, further including positioning a substrate to support the dielectric film and the circuit chip.

18. The method of claim 17, further including applying an additional dielectric layer over the flexible interconnect film, forming additional vias in the additional dielectric layer extending to the patterned metallization layer and the chip pads, and applying an additional patterned metallization layer through the additional vias to interconnect the patterned metallization layer and the chip pads.

19. A method for fabricating a flexible interconnect film, the method comprising:
   attaching a dielectric film to a frame having a coefficient of thermal expansion ranging from about 10 ppm/° C. to about 40 ppm/° C. lower than a coefficient of thermal expansion of the dielectric film;
   applying a resistor layer over the dielectric film, the resistor layer comprising a material facilitating adhesion of the dielectric film and the metallization layer; and then
   patterning a metallization layer over the dielectric film and the resistor layer to form a resistor while rigidly maintaining the attachment of the dielectric film to the frame.

20. The method of claim 19, wherein the frame is round.

21. The method of claim 20, wherein the step of applying the resistor layer comprises sputter-depositing tantalum nitride ($Ta_2N$) on the dielectric film.

22. The method of claim 19,
   wherein the step of applying the resistor layer over the dielectric film includes applying the resistor layer over both of two opposing surfaces of the dielectric film, and
   wherein the step of applying the metallization layer includes applying the metallization layer over at least portions of the resistor layer on the two opposing surfaces of the dielectric film.

23. The method of claim 22, wherein the dielectric film has vias therein, and the steps of applying the resistor and metallization layers include coupling the resistor and metallization layers respectively through the vias.

24. A method for fabricating a flexible interconnect film, the method comprising:
   attaching a dielectric film comprising a polyimide to a frame having a coefficient of thermal expansion ranging from about 10 ppm/° C. to about 40 ppm/° C. lower than a coefficient of thermal expansion of the dielectric film, wherein the frame is titanium or an invar ferronickel alloy; and patterning a metallization layer over the dielectric film while rigidly maintaining the attachment of the dielectric film to the frame.

25. The method of claim 24, wherein the frame is round.

26. The method of claim 25, wherein the frame has a diameter ranging from about 5 inches to about 7 inches.

27. The method of claim 24, wherein attaching the dielectric film to the frame includes applying an adhesive between the dielectric film and the frame.

28. The method of claim 27 wherein attaching the dielectric film to the frame further includes pressing and heating the dielectric film, the adhesive, and the frame to a temperature above the softening point of the adhesive.

29. The method of claim 24, wherein the temperature of the dielectric film remains less than or equal to about 150° C.

30. The method of claim 24, wherein a difference in the coefficient of thermal expansions of the frame and the dielectric film ranges from about 10 ppm/° C. to about 15 ppm/° C.

* * * * *